US006207034B1

(12) United States Patent
Madden et al.

(10) Patent No.: US 6,207,034 B1
(45) Date of Patent: Mar. 27, 2001

(54) METHOD OF MANUFACTURE OF POLYMER TRANSISTORS WITH CONTROLLABLE GAP

(75) Inventors: Peter Madden, Boston; John Madden, Somerville; Ian W. Hunter, Lincoln, all of MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 09/204,929

(22) Filed: Dec. 3, 1998

Related U.S. Application Data

(60) Provisional application No. 60/067,656, filed on Dec. 5, 1997.

(51) Int. Cl.[7] ................................................. C25D 5/02
(52) U.S. Cl. ........................ 205/122; 205/123; 205/114; 205/118; 205/136; 205/147; 205/317
(58) Field of Search .................................. 205/122, 123, 205/118, 136, 147, 317, 119

(56) References Cited

U.S. PATENT DOCUMENTS

| | | | |
|---|---|---|---|
| 4,968,390 | * 11/1990 | Bard et al. | 204/15 |
| 5,130,380 | * 7/1992 | Carew | 525/343 |
| 5,500,537 | 3/1996 | Tsumura et al. | 257/40 |
| 5,641,391 | 6/1997 | Hunter et al. | 205/80 |
| 5,710,051 | 1/1998 | Park et al. | 437/7 |

OTHER PUBLICATIONS

Jones, et al., "Preparation and Characterization of Molecule-Based Transistors with a 50-nm Source-Drain Separation with use of Shadow Deposition Techniques: Toward Faster, More Sensitive Molecule-Based Devices", J. Am. Chem. Soc., v. 109, pp. 5526-5528 (1987), no month available.

McCoy, et al., "Potential-Dependent Conductivity of Conducting Polymers Yields Opportunities for Molecule-Based Devices: A Microelectrochemical Push—Pull Amplifier Based on Two Different Conducting Polymer Transistors", Chemistry of Materials, v. 5, pp. 914-916 (1993), no month available.

Kranz, et al., "Lateral Deposition of Polypyrrole Lines over Insulating Gaps. Towards the Development of Polymer-Based Electronic Devices", Advanced Materials, v. 7, No. 6, pp. 568-571 (1995), no month available.

Madden, et al., "Three Dimensional Microfabrication by Localized Electrochemical Deposition", Journal of Microelectromechanical Systems, IEEE vol. 5, No. 1, Mar. 1996, pp. 24-32.

* cited by examiner

Primary Examiner—Kathryn Gorgos
Assistant Examiner—Christopher M. Keehan
(74) Attorney, Agent, or Firm—Bromberg & Sunstein LLP

(57) ABSTRACT

A method of manufacturing a polymer transistor having a controllable gap is provided in an embodiment. In the embodiment, a conducting tip is positioned proximate to a conducting surface so as to form a gap, an electrochemical medium is introduced in contact with the conducting tip and the conducting surface, and an electrical potential is applied across the electrochemical medium so as to deposit a conductive polymer that electrically bridges the formed gap. In another embodiment, a counter electrode is provided in the electrochemical solution, facilitating processing in which the electrochemical potential at the conducting tip and at the conducting surface are the same and there is a return path for electrical current through the counter electrode. Repositioning of the tip during and after polymer deposition provides, in a further embodiment, adds additional capability with respect to gap control and polymer properties.

24 Claims, 4 Drawing Sheets

METHOD OF MANUFACTURE OF POLYMER TRANSISTORS WITH CONTROLLABLE GAP

RELATED U.S. APPLICATION

The present application claims priority from Provisional Application Ser. No. 60/067,656, filed Dec. 5, 1997, which is hereby incorporated herein by reference.

TECHNICAL FIELD

The present invention pertains to a method of manufacturing polymer transistors using electrochemical scanning tunneling microscopy techniques.

BACKGROUND OF THE INVENTION

The operation of a polymer transistor is described with reference to FIG. 1. The transistor, designated generally by numeral 10, has opposing conductors, namely source 12 and drain 14, separated by a junction region 16 of conducting polymer.

Conducting polymers feature a conjugated carbon backbone. Some common conducting polymers are polyaniline, polypyrrole and polyacetylene. These materials are semiconductors. However, upon oxidation or reduction of the polymer, conductivity is changed. The oxidation or reduction leads to a charge imbalance which, in turn, results in a flow of ions into the material in order to balance the charge. These ions or dopants enter the polymer from a surrounding, ionically conductive medium, such as a gel, a solid electrolyte or a liquid electrolyte. If ions are already present in the polymer, they may exit when it is oxidized or reduced.

The electrical resistance of junction 16 is a function of the oxidation state of the conducting polymer. Polymer 16 is immersed in an electrochemical solution 18, or gel electrolyte, containing mobile ions, and the oxidation state of junction 16 is varied by changing the potential applied to a gate electrode 19 in solution 18 to drive ions into or out of the junction 16. The state of higher conductivity (or, equivalently, lower resistivity) of the junction 16 is referred to as the 'ON' state, while the state of lower conductivity (or higher resistivity) is referred to as the 'OFF' state. Of course, description in terms of binary states is merely a descriptive convenience and more states of intermediate conductivity may be defined or employed.

Relevant characteristics of a polymer transistor include the junction resistance in both the low- and high-resistance states, switching speed of the transistor and the amount of charge needed to switch the resistance of the device. It is desirable to provide a method for manufacturing a polymer transistor which allows a small junction size to be fabricated controllably and reliably, so as to decrease resistance in the ON state (thereby minimizing energy loss in the transistor), increase switching rates, and decrease the amount of charge needed for switching. Current techniques provide junctions having widths no smaller than on the order of 50 nanometers. Polymer transistors are currently fabricated using lithographic processes such as described by E. Paul, et al., "Resistance of Polyaniline Films as a Function of Electrochemical Potential and the Fabrication of Polyaniline-Based Microelectronic Devices," 89 *J. Phys. Chem.*, 1441–47 (1985), which is incorporated herein by reference. C. Kranz, et al. in "Lateral Deposition of Polypyrrole Lines over Insulating Gaps," *Advanced Materials* v.7, n.6, 568–71 (1995) describes employing a scanning microscopy tip to electrochemically deposit lines of polypyrrole on a two-dimensional surface and creating a transistor by connecting the lines. Junction or gap dimensions are not controllable with this method.

SUMMARY OF THE INVENTION

In accordance with one aspect of the invention, in a preferred embodiment, there is provided a method of manufacturing a polymer transistor. The method has the steps of positioning a conducting tip proximate to a conducting surface so as to form a gap, introducing an electrochemical medium in contact with the conducting tip and the conducting surface, and applying an electrical potential across the electrochemical solution so as to deposit a conductive polymer that electrically bridges the gap. The surface may be non-planar or may be a second conducting tip. The electrochemical medium may be an electrochemical solution or a gel electrolyte. In accordance with an alternate embodiment of the invention, an additional step of immersing the conductive polymer in an electrolyte solution is included. The step of positioning, may in other embodiments, include monitoring presence of tunneling current between the conducting tip and the conducting surface, and, alternatively, include monitoring a position of electrical contact between the tip and the surface. The step of applying an electrical potential may include depositing a conductive polymer on both the conducting tip and the conducting surface. In accordance with another embodiment, the applying step may include maintaining an electrochemical potential difference between the tip and the surface. The method may, additionally, have the step of immersing a counter electrode in the electrochemical solution, in which case the step of applying an electrical potential includes maintaining the conducting tip and the conducting surface at the same electrochemical potential and providing a return path for current through the counter electrode.

In accordance with a further, alternate embodiment of the present invention, the step of applying an electrical potential may include maintaining an electrochemical potential difference between the conducting tip and the conducting surface. In this embodiment, a further step may include separating the conducting tip from the conducting surface by a predetermined distance from a position of onset of tunneling current between the conducting tip and the conducting surface. In accordance with yet another embodiment, the conducting tip may be repositioned after applying the electrical potential.

In accordance with another aspect of the present invention, there is provided a polymer transistor manufactured by a method of positioning a conducting tip proximate to a conducting surface so as to form a gap, introducing an electrochemical medium in contact with the conducting tip and the conducting surface, and applying an electrical potential across the electrochemical medium so as to deposit a conductive polymer that electrically bridges the gap. In a further embodiment, a method of manufacturing a plurality of conducting polymer transistors on a single conducting surface is provided.

DETAILED DESCRIPTION OF SPECIFIC EMBODIMENTS

Figure 1:
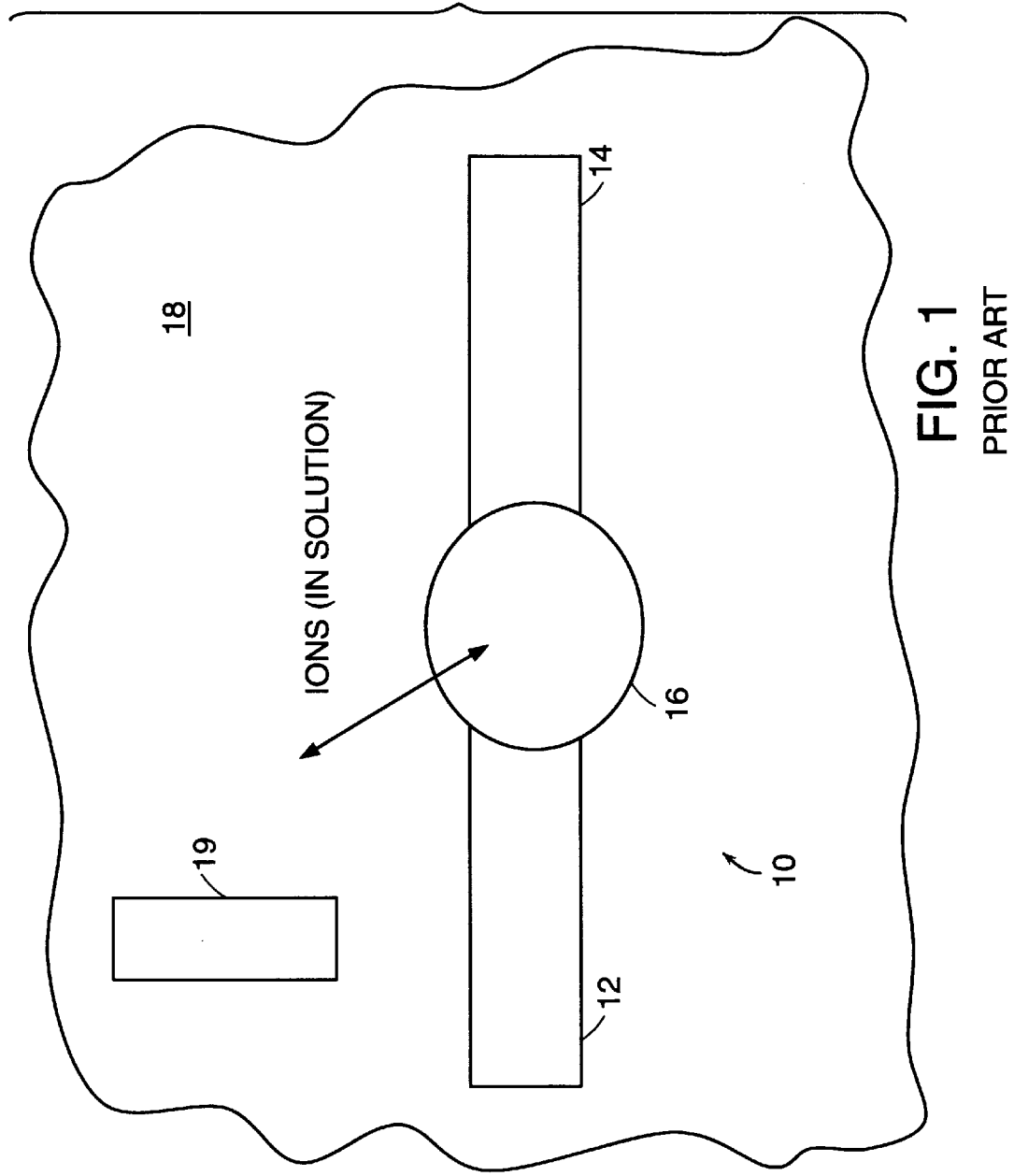
FIG. 1 is a schematic diagram of a prior art polymer transistor.
Figure 2:
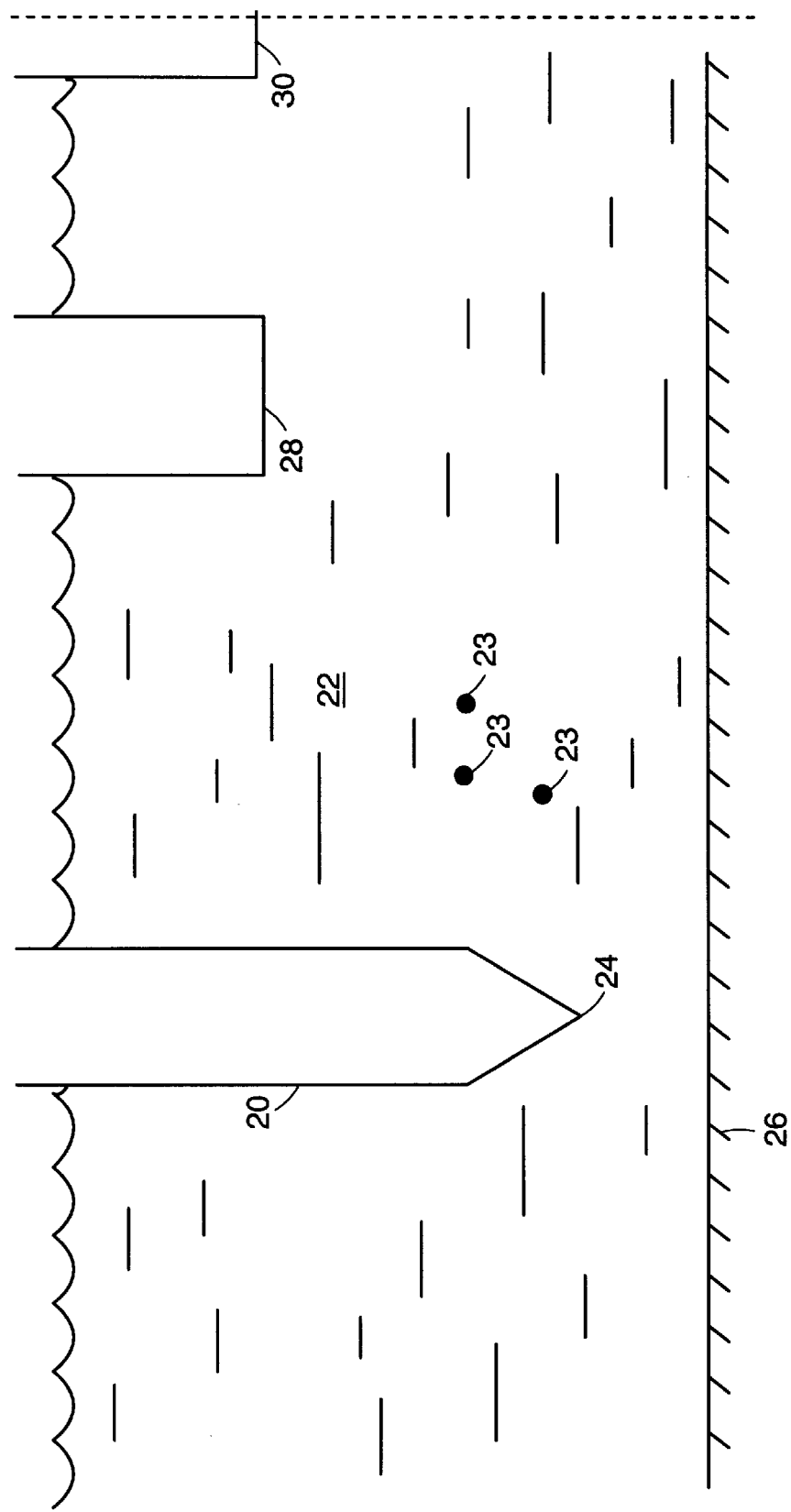
FIG. 2 shows the components employed in precision deposition of a polymer transistor junction in accordance with an embodiment of the invention.

Methods of manufacturing a conductive polymer transistor in accordance with preferred embodiments of the invention are described with reference to FIGS. 2–4, wherein the same numerals are used to designate similar or identical components. Referring to FIG. 2, a conducting tip 20 is immersed in an electrochemical solution 22, or, more generally, in an electrochemical medium. A gel electrolyte may also be used in the same manner as will be described with respect to electrochemical solution 22. Electrochemical solution 22 contains, in solution, monomers 23 of conducting polymers. Solution 22 may be any such electrochemical solution known in the art. All such electrochemical solutions are within the scope of the present invention; however, particular solutions are to be preferred in accordance with specialized applications. Conducting tip 20 has a pointed extremal tip 24 which is substantially atomically sharp. Conducting tip 20 may be positioned, by means of one or more piezoelectric positioners or any other precision actuator (not shown) proximate to conducting surface 26. It is to be understood that although conducting surface 26 is depicted as planar, the surface may have any desired geometry, including that of a second conducting tip in close proximity to conducting tip 20. In a preferred embodiment of the invention, to be described below, conducting tip 20 and conducting substrate 26 are maintained at the same electrochemical potential during the process of electrodeposition of conductive polymer from solution, and a return path for electrical current through electrochemical solution 22 is provided via a counter electrode 28. Counter electrode 28 is an electrode made of conducting material (known in the art) which is immersed in electrochemical solution 22. A reference electrode 30 may also be immersed in electrochemical solution 22 for monitoring the electrical potential during electrochemical deposition. In another embodiment of the invention, conducting tip 20 and conducting substrate 26 are held at different electrochemical potentials. The potentials may be held constant or may be varied; counter electrode 28 may or may not be included whether tip 20 and substrate 26 are held at the same or different potentials. The current passing out of tip 20 to substrate 26 may be used to monitor the growth of the conductive polymer during deposition. Holding tip 20 and substrate 26 at different potentials may, also, for example, help to orient the resultant polymer molecules, thereby tailoring the polymer's properties in the gap.

Figure 3:
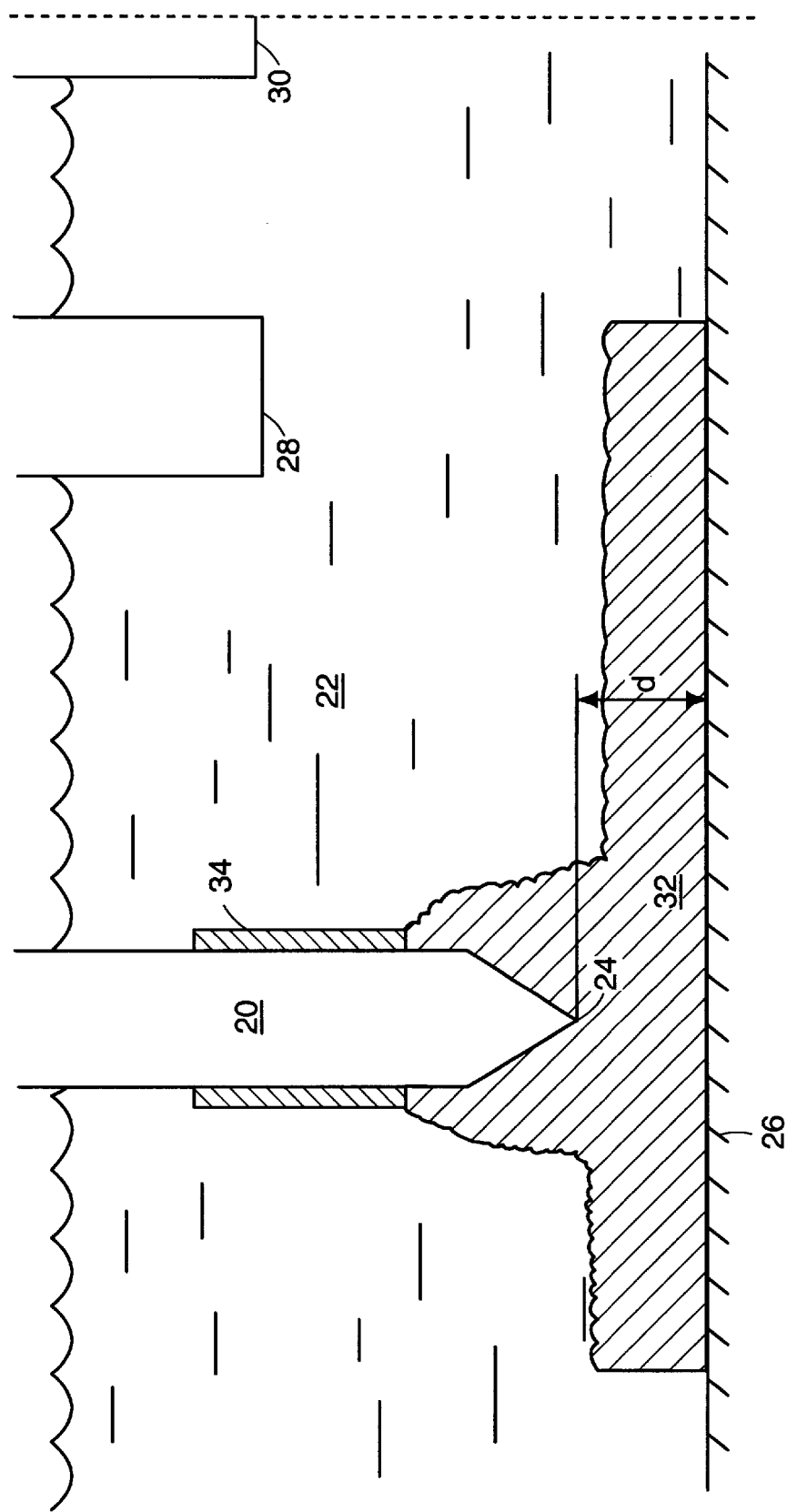
FIG. 3 shows the components of FIG. 2 during the process of precision deposition of a polymer transistor junction in accordance with an embodiment of the invention.

Referring now to FIG. 3, the process of manufacturing a polymer transistor is initiated, in accordance with a preferred embodiment of the invention, by moving pointed extremal tip 24 of conducting tip 20 to within a specified distance d from conducting substrate 26. In accordance with an embodiment of the present invention, use is made of the technology of scanning tunneling microscopes (STMs) which are routinely used to make measurements of surface profiles. Such measurements are of very high resolution, on the order of tens of picometers. Piezoelectric crystal actuators may be used to keep the separation d uniform to within this resolution. In particular, conducting tip 20 may be moved toward conducting surface 26 until the onset of tunneling current between the tip 20 and the surface 26, indicating a proximity of less than, approximately, a nanometer. Then, the positioning actuator may be used to position conducting tip 20 such that separation d is a predetermined distance, typically in the range between one nanometer and several micrometers. Alternatively, the positioning of tip 20 may include monitoring of a position of electrical contact (rather than the onset of tunneling current) and separating tip 20 from surface 26 by distance d.

Tip 20 and substrate 26 are immersed in electrochemical solution 22 from which conductive polymer 32 is deposited. In accordance with an embodiment of the invention, electrical current is applied through electrochemical solution 22 such that tip 20 and substrate 26 are at the same electrochemical potential, while a current return path is provided through counter electrode 28. In this configuration, conductive polymer 32 is deposited on both tip 20 and substrate 26 simultaneously. Either direct (DC) or alternating (AC) potentials may be applied. In accordance with another embodiment of the invention, tip 20 may be used as the current return path, with tip 20 at a different electrochemical potential from that of substrate 26.

Using either method of electrodeposition, conductive polymer 32 is deposited between tip 20 and substrate 26 so as to bridge the initial gap between them, thereby forming a transistor junction. The electrical bridging of the gap may be monitored during the electrodeposition by applying a small potential between tip 20 and substrate 26 and measuring the resultant current.

In accordance with an embodiment of the invention, parasitic currents in the finished conducting polymer transistor may be reduced by providing insulation 34 surrounding tip 20 at all but its extremal tip 24 so that conductive polymer 32 is deposited only proximate to the extremal tip 24. Similarly, insulation may be provided on substrate 26, to reduce the effective area of the resulting transistor.

In a further embodiment, tip 20 may be repositioned during deposition or after deposition is completed. The gap width is, thus, actively controlled by the movement of tip 20. In addition, in all of the aforementioned embodiments, the transistor which results is a three-dimensional component in the sense that the entire tip 20 is part of the resulting component. The distance d (a measure of the gap) may be held constant or varied during deposition. Distance d may be held constant until deposition is terminated and subsequently changed by repositioning tip 20. The conductive polymer may be stretched, aligned, oriented, or otherwise altered by repositioning tip 20. In addition, it may be possible to modulate transistor properties (such as, for example, gain) based upon the deformation imparted to the conductive polymer.

Figure 4:
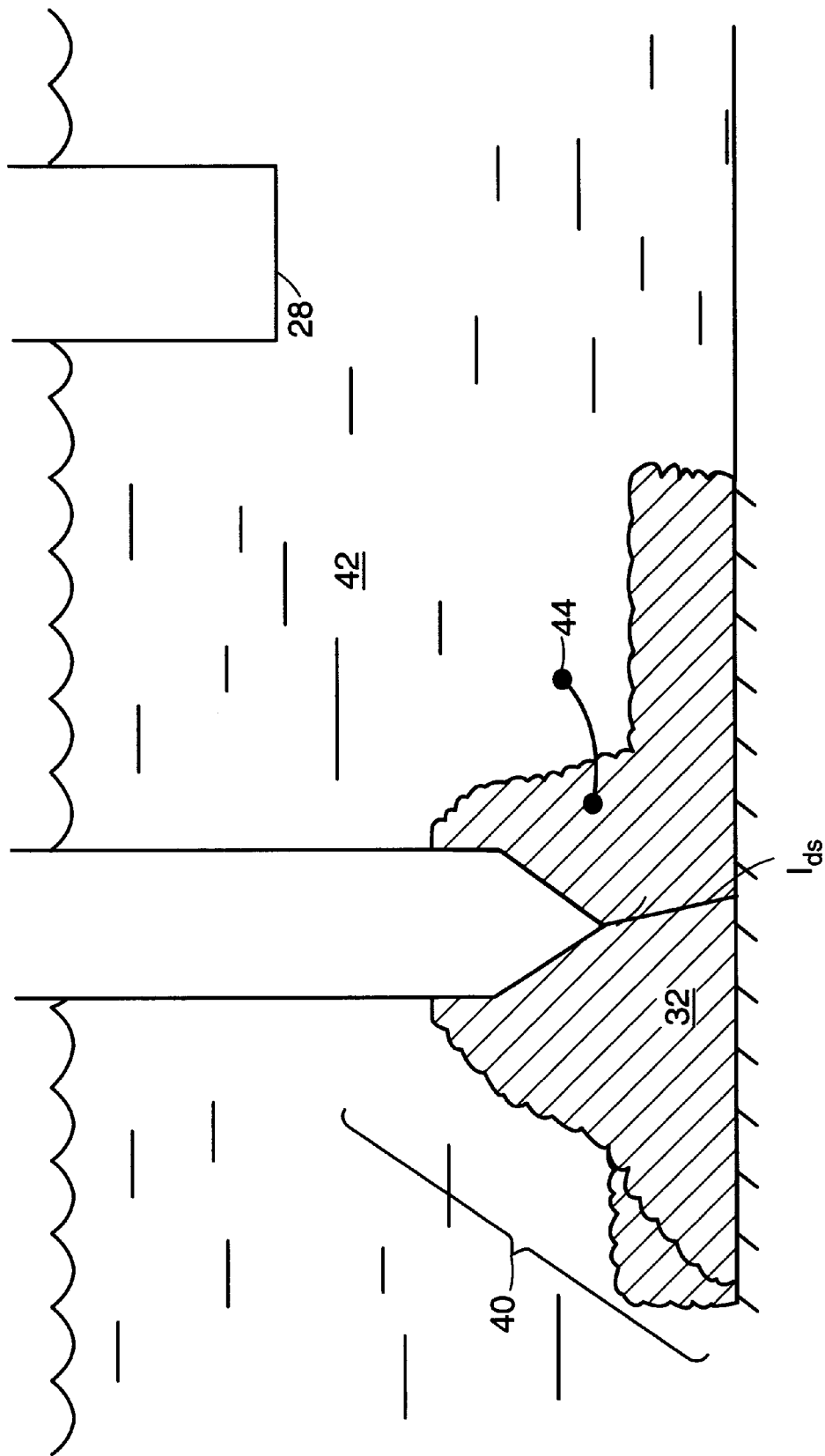
FIG. 4 is a cross-sectional side view of a polymer transistor, in one embodiment, manufactured in accordance with an embodiment of the present invention.

An embodiment of a conductive polymer transistor fabricated in accordance with an embodiment of the present invention is shown in FIG. 4. Junction 40 formed by conducting tip 20, conductive polymer 32 and conducting substrate 26 is immersed in an electrolyte solution 42 containing dopant ions 44. Electrolyte solution 42 (which may also be a gel), exchanges ions 44 with conductive polymer 32 which, in turn, changes the electrical conductivity of the polymer 32. The flow of dopant ions 44 is controlled by the electrical potential applied to electrode 28 with respect to conductive tip 20 and conductive substrate 26. Electrode 28 thus serves as a transistor gate. If a second potential is applied between tip 20 and substrate 26, the current $I_{ds}$ that flows between the tip 20 and the substrate 26 will depend on the resistance of the conductive polymer 32 between the tip 20 and the substrate 26. Therefore, by varying the gate potential to move ions into or out of the polymer 32, the current flowing between tip 20 and substrate 26 may be controlled.

Using the method described, multiple conductive polymer transistors may be fabricated on a single substrate. In accordance with alternate embodiments of the invention, electrolyte volumes surrounding respective junctions may be isolated by membranes such as lipid bilayers, or, otherwise, are contained within micro wells separating regions of liquid or gel in contact with substrate 26 and each containing at least one conductive tip 20. Alternatively, in accordance with another embodiment of the invention, a single gate may be used to switch a plurality of transistors in order to control larger currents than may be controlled by switching a single transistor. If the polymer transistors are sufficiently separated and if the resistance of electrolyte solution 42 is high, it may not be necessary to electrically isolate each transistor from each other. Inclusion of a large reference electrode 30 (from FIG. 2) may be used to define an average electrolyte potential.

While the invention has been described in detail, it is to be clearly understood that the same is by way of illustration and example and is not to be taken by way of limitation. Indeed, numerous variations and modifications will be apparent to those skilled in the art. All such variations and modifications are intended to be within the scope of the present invention as defined in the appended claims.

We claim:

1. A method of manufacturing a polymer transistor, the method comprising:

positioning a conducting tip proximate to a conducting surface so as to form a gap, introducing an electrochemical medium in contact with the conducting tip and the conducting surface, and applying an electrical potential across the electrochemical medium so as to deposit a conductive polymer that electrically bridges the gap so as to include the conducting tip as a part of the transistor.

2. A method according to claim 1, wherein positioning includes monitoring presence of tunneling current between the conducting tip and the conducting surface.

3. A method according to claim 1, wherein positioning includes monitoring a position of electrical contact between the conducting tip and the conducting surface.

4. A method according to claim 1, wherein, in introducing, the electrochemical medium comprises an electrochemical solution.

5. A method according to claim 1, wherein, in introducing, the electrochemical medium comprises a gel electrolyte.

6. A method according to claim 1, wherein applying includes maintaining an electrochemical potential difference between the conducting tip and the conducting surface.

7. A method according to claim 6 further comprising:

separating the conducting tip from the conducting surface by a predetermined distance from a position of onset of tunneling current between the conducting tip and the conducting surface.

8. A method according to claim 1, wherein applying includes depositing a conductive polymer on both the conducting tip and the conducting surface.

9. A method according to claim 4 further comprising:

immersing a counter electrode in the electrochemical solution, wherein applying includes maintaining the conducting tip and the conducting surface at the same electrochemical potential and providing a return path for electrical current through the counter electrode.

10. A method according to claim 1 further comprising: immersing the conductive polymer in an electrolyte solution.

11. A method according to claim 1 further comprising:

repositioning the conducting tip, wherein repositioning is performed after applying.

12. A method according to claim 11, wherein repositioning is performed a plurality of times.

13. A method according to claim 10, wherein the conducting surface is non-planar.

14. A method according to claim 13, wherein the conducting tip is a first conducting tip and the conducting surface is a second conducting tip.

15. A method according to claim 1, further comprising:

repositioning the conducting tip, wherein repositioning is performed concurrently with applying.

16. A polymer transistor manufactured by a method comprising:

positioning a conducting tip proximate to a conducting surface so as to form a gap;

introducing an electrochemical medium in contact with the conducting tip and the conducting surface;

applying an electrical potential across the electrochemical medium so as to deposit a conductive polymer that electrically bridges the gap so as to include the conducting tip as a part of the transistor;

immersing the conductive polymer in an ionically conducting material; and providing a counter electrode adapted to perform as a transistor gate.

17. A polymer transistor according to claim 16, wherein the ionically conducting material is an electrolytic solution contain dopant ions.

18. A polymer transistor manufactured by a method comprising:

positioning a conducting tip proximate to a conducting surface so as to form a gap;

introducing an electrochemical medium in contact with the conducting tip and the conducting surface;

applying an electrical potential across the electrochemical medium so as to deposit a conductive polymer that electrically bridges the gap so as to include the conducting tip as a part of the transistor;

repositioning the conducting tip at least once after applying the electrical potential;

immersing the conductive polymer in an ionically conducting material; and providing a counter electrode adapted to perform as a transistor gate.

19. A method of manufacturing a plurality of conducting polymer transistors on a single conducting surface, the method comprising:

positioning a plurality of conducting tips proximate to the conducting surface so as to form gaps between each of the plurality of conducting tips and the conducting surface;

introducing an electrochemical medium in contact with the conducting tips and the conducting surface; and applying an electrical potential across the electrochemical medium so as to deposit a conductive polymer that electrically bridges the gaps so as to include the conducting tips as part of the transistors.

20. A method according to claim 19 further comprising:
immersing the conductive polymer in an ionically conducting material.

21. A method according to claim 20 further comprising:
providing a plurality of volumes of electrolytes, the volumes being electrically isolated from one another, each volume in contact with a single conducting tip.

22. A method of manufacturing a polymer transistor, the method comprising:
positioning a conducting tip proximate to a conducting surface so as to form a gap,
introducing an electrochemical medium in contact with the conducting tip and the conducting surface,
applying an electrical potential across the electrochemical medium so as to deposit a conductive polymer that electrically bridges the gap, and
introducing a counter electrode in the electrochemical medium, wherein applying includes maintaining the conducting tip and the conducting surface at the same electrochemical potential and includes providing a return path for electrical current through the counter electrode.

23. A method according to claim 22 wherein, in introducing an electrochemical medium, the medium comprises an electrochemical solution.

24. A method according to claim 23, wherein repositioning is performed a plurality of times.

* * * * *